United States Patent
Li

(10) Patent No.: US 7,142,571 B2
(45) Date of Patent: Nov. 28, 2006

(54) STACK-TYPE DIODE LASER DEVICE

(76) Inventor: Chian Chiu Li, 859 Blair Ave. #2, Sunnyvale, CA (US) 94087-1118

( * ) Notice: Subject to any disclaimer, the term of this patent is extended or adjusted under 35 U.S.C. 154(b) by 266 days.

(21) Appl. No.: 10/841,728

(22) Filed: May 8, 2004

(65) Prior Publication Data

US 2004/0223526 A1  Nov. 11, 2004

Related U.S. Application Data

(60) Provisional application No. 60/469,306, filed on May 9, 2003.

(51) Int. Cl.
*H01S 3/13* (2006.01)
*H01S 5/00* (2006.01)
*H01S 3/08* (2006.01)
*G02B 6/34* (2006.01)
*G02B 6/26* (2006.01)

(52) U.S. Cl. .................. 372/29.023; 372/50.123; 372/108; 385/37; 385/50

(58) Field of Classification Search ........... 372/29.023, 372/50.123, 108; 385/37, 50
See application file for complete search history.

(56) References Cited

U.S. PATENT DOCUMENTS

| | | | | |
|---|---|---|---|---|
| 3,871,742 A | * | 3/1975 | Kaminow et al. | ............. 385/37 |
| 4,852,968 A | * | 8/1989 | Reed | ............. 385/127 |
| 5,638,391 A | | 6/1997 | Shima | |
| 5,745,625 A | * | 4/1998 | Aikiyo et al. | ............. 385/94 |
| 6,167,072 A | | 12/2000 | Zory, Jr. | |
| 6,600,765 B1 | * | 7/2003 | Evans et al. | ............. 372/50.1 |
| 6,865,310 B1 | * | 3/2005 | Yokouchi | ............. 385/16 |
| 2002/0034205 A1 | * | 3/2002 | Evans et al. | ............. 372/50 |
| 2003/0048992 A1 | * | 3/2003 | Lundqvist | ............. 385/50 |

OTHER PUBLICATIONS

D. Botez and D. E. Ackley, "Phase-Locked Arrays of Semiconductor Diode Lasers," IEEE Circuits And Devices, 1986, vol. 2, No. 1, pp. 8-16.

G. A. Evans, J. B. Kirk, Z. A. Hilali, N. Y. Amarasinghe, D. Phan, G. Happawana, B. Dinkespiler, T. Masood and C. Davis,"Grating-Outcoupled Surface-Emitting Semiconductor Lasers at 1310 and 1550 nm," Proceedings of SPIE, vol. 4649, "Vertical-Cavity Surface-emitting Lasers VI," 2002, pp. 106-110.

* cited by examiner

*Primary Examiner*—Minsun O. Harvey
*Assistant Examiner*—Hrayr A. Sayadian

(57) ABSTRACT

Two thin-clad laser diodes are disposed to form a stack-type diode laser device. The diodes emit two beams that are substantially parallel and in proximity such that they share many fiberoptic systems designed for a single beam. The diodes are coupled by leaky waves through top surfaces. The leaky waves are generated by a thin metal contact layer or diffractive gratings. The stack-type device is employed for single-mode power enhancement and tunable lasers.

16 Claims, 3 Drawing Sheets

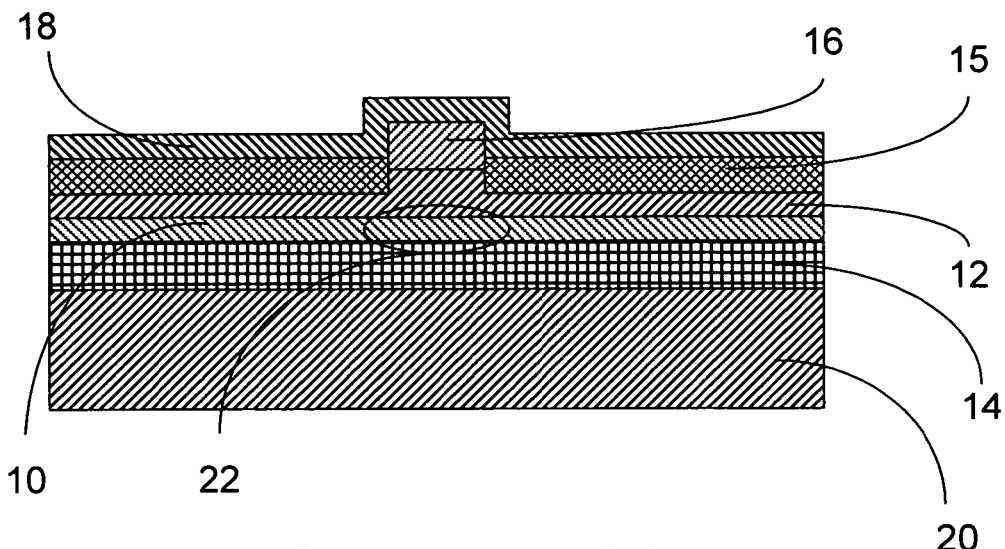
FIG. 1-A (*Prior Art*)
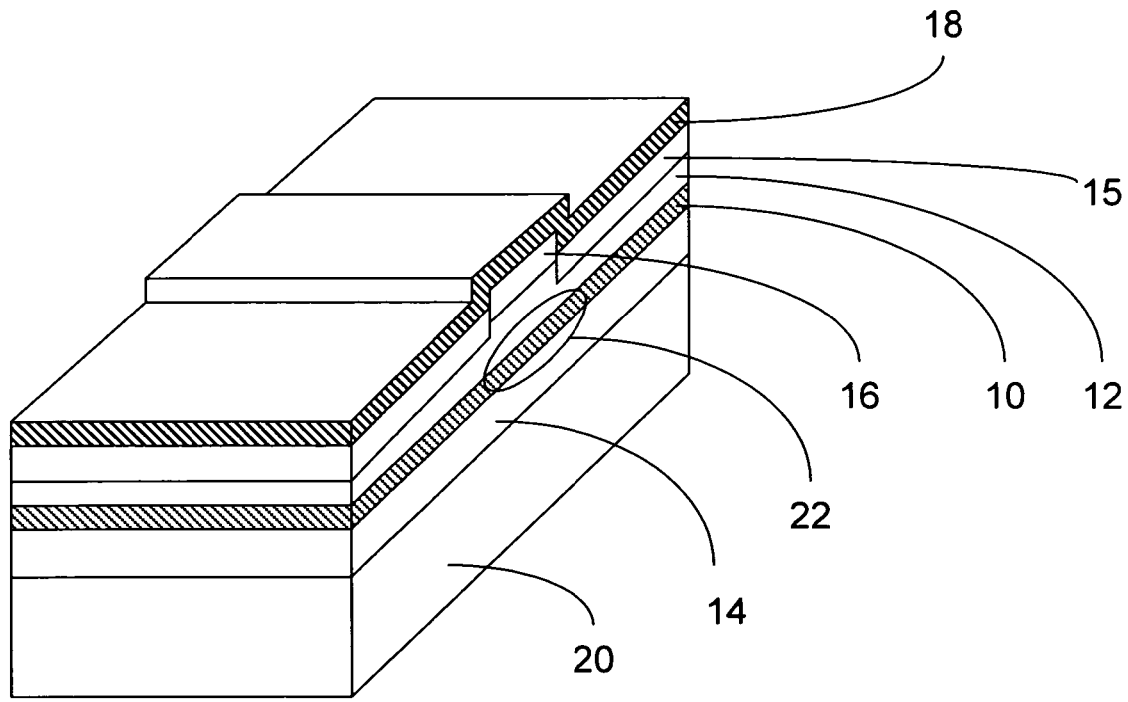
FIG. 1-B (*Prior Art*)

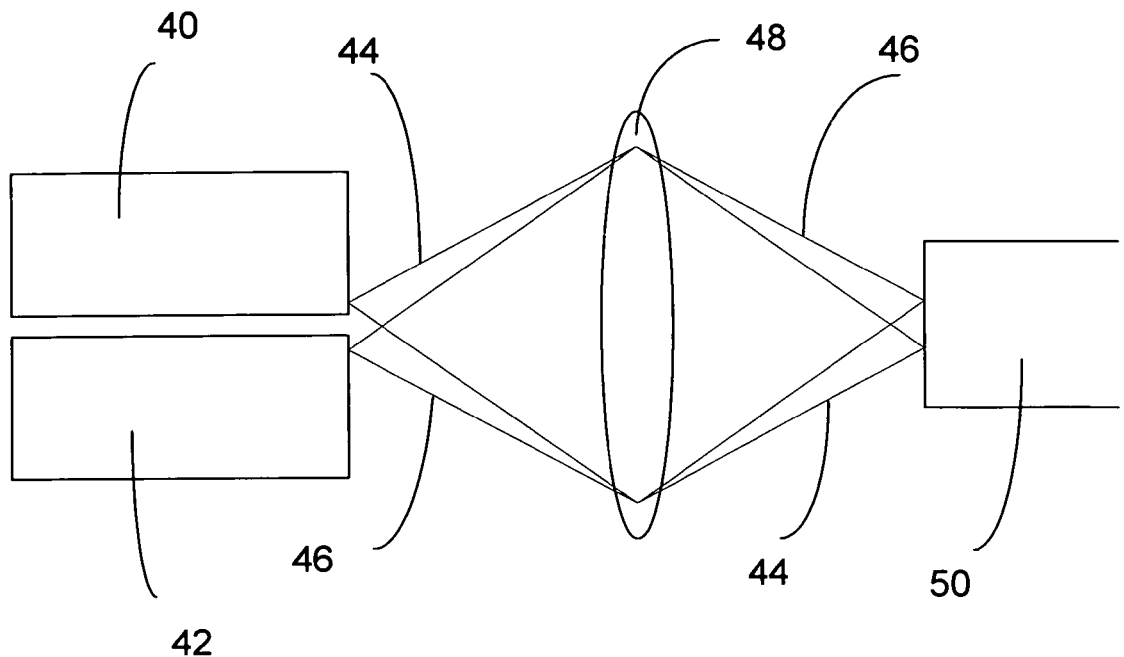
FIG. 1-C (*Prior Art*)
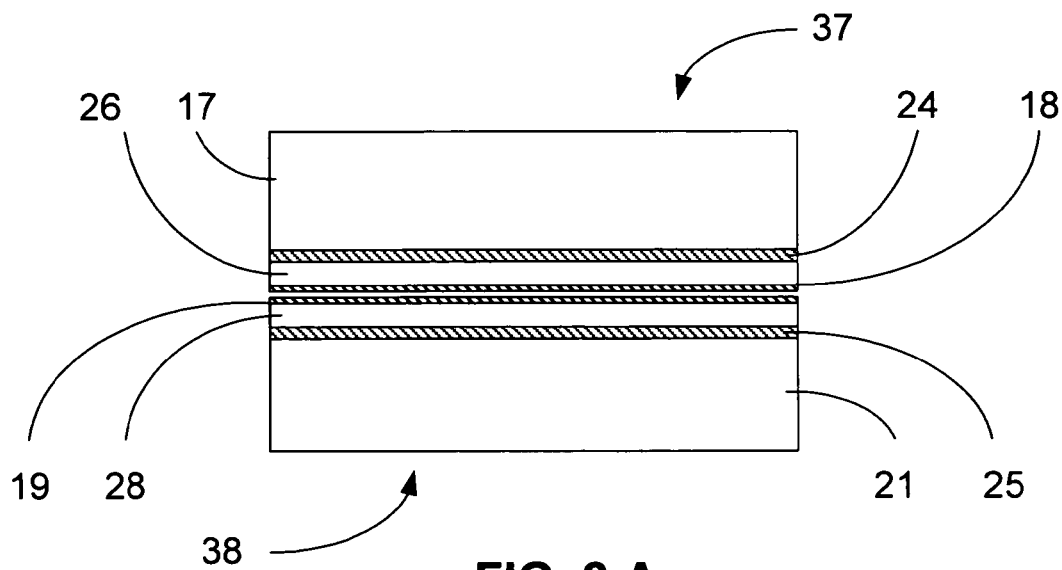
FIG. 2-A

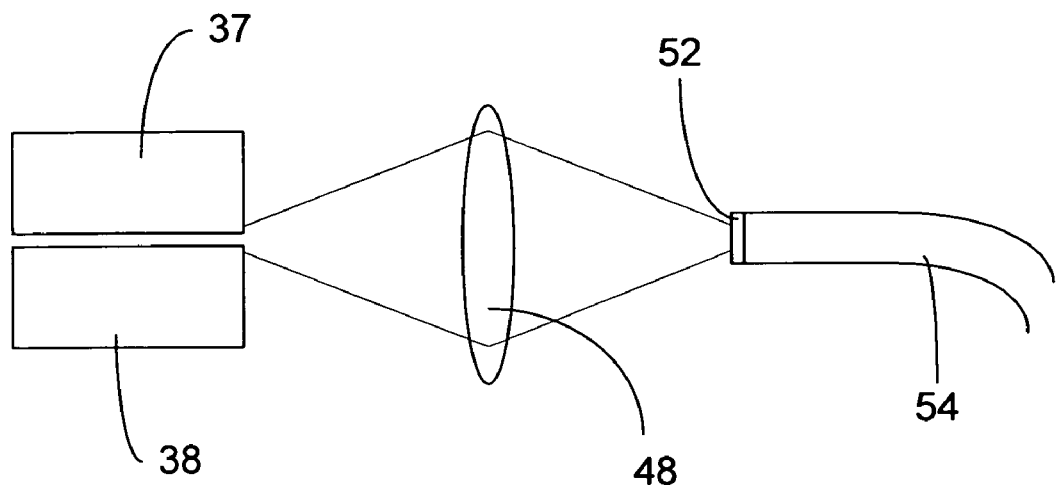
FIG. 2-B
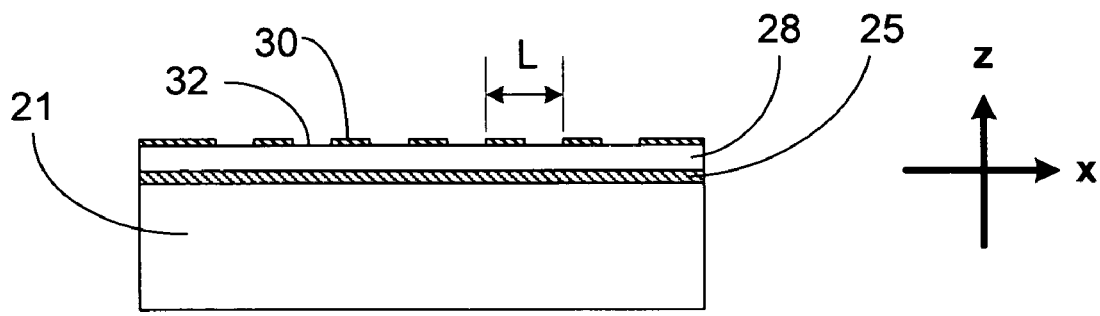
FIG. 3
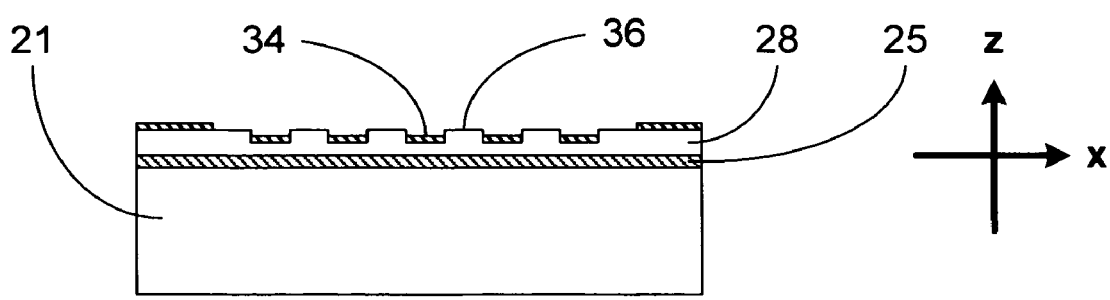
FIG. 4

STACK-TYPE DIODE LASER DEVICE

CROSS REFERENCE TO RELATED APPLICATION

This application is related to my U.S. regular patent application Ser. No. 10/285,022, now U.S. Pat. No. 6,901,086, which is incorporated herein by reference.

This application is entitled to the benefit of Provisional Patent Application Ser. No. 60/469,306 filed 2003 May 9.

FEDERALLY SPONSORED RESEARCH

Not applicable

SEQUENCE LISTING OR PROGRAM

Not applicable

BACKGROUND

1. Field of Invention

This invention relates to semiconductor lasers, and particularly to stack-type semiconductor laser devices.

2. Description of Prior Art

As used here, the term "semiconductor laser" or "diode laser" means edge-emitting diode lasers. Edge-emitting diode lasers have a horizontal cavity and emit light beams in a direction parallel to the wafer's plane or an active region of the wafer. Most semiconductor lasers in use are edge-emitting and are used for laser printers, fiberoptic telecommunication systems, and optical data storage devices.

A diode emits an output light beam with a spatial power distribution. The output of a single transverse mode diode, or a single-mode diode, has a single lobe in its spatial power distribution, while a multimode output has multiple lobes. Single-mode diode lasers are desirable in many fields, especially in fiberoptic telecommunications and optical data storage. However one of the weaknesses of single-mode diode lasers is that they have relatively low output power.

The importance of tunable wavelength diode lasers has grown dramatically in fiberoptic telecommunications in recent years. Tunable lasers have three important specifications, i.e., output power, wavelength tuning range, and tuning speed. A typical high output power is about 20 milliwatts. A typical wide tuning range is about 40 nanometers, e.g., the diode can emit light from 1525 to 1565 nm. A fast tuning speed is in a range of several nanoseconds. Among various tunable lasers, distributed feedback (DFB) lasers offer high power, but suffer a narrow tuning range and a slow tuning speed. Three-section distributed Bragg reflector (DBR) lasers have a fast tuning speed and moderate power, but a narrow tuning range. Sampled grating DBR (SG-DBR) lasers and superstructure grating DBR (SSG-DBR) lasers have a wide tuning range and a fast tuning speed, but low output power. Conventional tunable external cavity diode lasers benefit from high power and a wide tuning range, but suffer a slow tuning speed. Thus current tunable lasers can't satisfy the three specifications: high power, wide tuning range, and fast tuning speed.

One approach to overcome limitations on the single-mode output power and tunable laser involves stacking two thin-clad laser diodes to form a stack-type diode laser device and coupling the diodes, as is disclosed in my above regular U.S. patent application. The thin-clad diodes emit two beams which are substantially parallel and proximate such that they can simultaneously feed a fiberoptic system designed for a single beam. When the diodes are coupled in phase, their outputs can be combined to increase single-mode power, or novel tunable lasers can be created to meet the three specifications. However, the disclosed coupling mechanisms rely on external feedbacks, which require additional optics. The resulting stack-type device is complicated and bulky.

OBJECTS AND ADVANTAGES

Accordingly, several main objects and advantages of the present invention are:

(a). to provide an improved stack-type diode laser device;

(b). to provide such a device which has a simple and compact structure;

(c). to provide such a device which has a simple and compact structure and generates higher output power than that obtainable from a single laser diode;

(d). to provide a tunable laser which has a simple and compact structure and has high power, a wide tuning range, and a fast tuning speed.

Further objects and advantages will become apparent from a consideration of the drawings and ensuing description.

SUMMARY

In accordance with the present invention, two thin-clad diodes are stacked together with the top surfaces opposite each other. The diodes are coupled by leaky waves through their top surfaces. The leaky waves can be generated by a thin metal contact layer or diffractive gratings. The resulting device is simple, compact, and can be used to combine output power of the diodes or create a tunable laser which has high power, a wide tuning range, and a fast tuning speed.

ABBREVIATIONS

DBR Distributed Bragg reflector

DFB Distributed feedback

SG-DBR Sampled grating-distributed Bragg reflector

SSG-DRR Superstructure grating-distributed Bragg reflector

DRAWING FIGURES

FIG. 1-A is a schematic cross-sectional view of a typical prior-art ridge-guide laser diode.

FIG. 1-B is a schematic perspective view of a typical prior-art ridge-guide laser diode.

FIG. 1-C is a schematic cross-sectional view of a prior-art stack-type diode laser device.

FIG. 2-A is a schematic cross-sectional view illustrating an embodiment of a stack-type diode laser device according to the invention.

FIG. 2-B is a schematic cross-sectional view illustrating a stack-type diode laser device coupled to a single-mode fiber according to the invention.

FIGS. 3 and 4 are schematic cross-sectional views illustrating embodiments of a thin-clad laser diode having different diffraction gratings on the top surface according to the invention.

REFERENCE NUMERALS IN DRAWINGS

| | |
|---|---|
| 10 | active region |
| 12 | p-cladding layer |
| 14 | n-cladding layer |
| 15 | insulator region |
| 16 | contact layer |
| 17 | substrate and cladding layer |
| 18 | metal contact layer |
| 19 | metal contact layer |
| 20 | n-type substrate |
| 21 | substrate and cladding layer |
| 22 | light-emitting spot |
| 24 | active region |
| 25 | active region |
| 26 | cladding and contact layer |
| 28 | cladding and contact layer |
| 30 | grating element |
| 32 | grating element |
| 34 | grating element |
| 36 | grating element |
| 37 | thin-clad diode |
| 38 | thin-clad diode |
| 40 | thin-clad diode |
| 42 | thin-clad diode |
| 44 | output beam |
| 46 | output beam |
| 48 | lens system |
| 50 | single-mode fiber |
| 52 | anti-reflection coating |
| 54 | single-mode fiber |

DETAILED DESCRIPTION

FIGS. 1-A to 1-C—Prior-Art

FIGS. 1-A and 1-B show schematic cross-sectional and perspective views of a typical prior-art ridge-guide laser diode. The diode is fabricated on an n-type substrate 20, which usually is a thin square or rectangular semiconductor chip with a thickness around one hundred microns. Deposited on substrate 20 are an n-type cladding layer 14, an active region 10 of the diode, where light is generated, a p-type cladding layer 12, a p-type contact layer 16, two separate insulator regions 15, and a metal contact layer 18 as a top electrode. The diode emits light beams from an elliptical region 22 on the edge or side of the diode.

As shown in the figures, a protrusion, ridge, or boss is formed by etching layer 16 and part of layer 12 in the center portion of the chip. A top surface comprises the upward surface area of the protruded part of layer 18. The layers between active region 10 and the top surface have a total layer thickness of about two microns for a regular thick-clad diode. In the case of a thin-clad design, the total layer thickness can be reduced to several tenths of one micron.

FIG. 1-C illustrates schematically a prior-art stack-type diode laser device. The arrangement comprises a lens system 48, a single-mode fiber 50, and thin-clad diodes 40 and 42 which generate respective output beams 44 and 46. The beams are coupled into fiber 50 by lens system 48. The diodes are opposite each other, or in other words, their top surfaces face each other. Due to the nature of thin-clad diode, when diodes 44 and 46 are disposed such that they are in close distance, beams 44 and 46 can be arranged to be substantially parallel and proximate. For example, the separation between the two beams can be smaller than one micron. In such a case, two beams at 1.55-micron wavelength can share lens system 48 and fiber 50 simultaneously with a relatively small additional coupling loss, which is about 0.2 dB comparing to a case where a single diode is coupled to a single-mode fiber through a coupling lens.

However, the diodes in FIG. 1-C don't interact with each other directly. In the prior-art, the diodes are coupled by feedbacks which coupling optics generates. The coupling optics makes the stack-type device complicated and bulky.

FIG. 2-A—Stack-Type Device with a Thin Metal Contact Layer

FIG. 2-A shows schematically a cross-sectional view of a preferred embodiment of a stack-type device according to the invention (Supporting and bonding structures are not shown). The cross section is cut along a direction of light propagation. Thin-clad ridge-guide diodes 37 and 38 are opposite and each have a similar layered structure to that of FIG. 1-A. Layers 18 and 19 are thin metal contact layers. Active regions 24 and 25 lie between regions 26 and 28 and regions 17 and 21, respectively. Regions 26 and 28 contain cladding and contact layers. Regions 17 and 21 contain cladding and substrate layers. The diodes are disposed such that their top surfaces are proximate and their output beams (not shown) are parallel to a certain degree.

Because of the thin-clad design, light waves propagating inside the diode interact with the metal contact layer in a greater degree than a thick-clad diode. Parts of the light waves are reflected back by the metal layer, and parts of them leak out through it. Since the diodes' top surfaces are opposite each other, a portion of the leaking waves of one diode enters the other diode and vice versa. Thus each diode has a portion of its light wave coupled in the other diode. When the coupling intensity is strong enough, the diodes influence each other in terms of phase and mode selection of their propagating light waves. The light waves inside the diodes can be locked in phase.

The coupling efficiency of the two diodes depends upon the intensity of the leaking waves. The leakage intensity in turn depends upon property of the metal contact layer, the metal layer thickness, and the diode structure. The thinner the metal layer, the larger the leakage. But the metal contact layer can't be too thin. First, leakage causes power loss; second, the metal contact layer is responsible for electrical contact so it must have an adequate thickness.

FIG. 2-B—Stack-Type Device Coupled to a Single-Mode Fiber

When two diodes of a stack-type device are coupled in phase directly, the device can have a simple and compact structure to provide power enhancement and a wavelength tuning mechanism. FIG. 2-B shows schematically a cross-sectional view of an embodiment of a stack-type device according to the invention. Thin-clad diodes 37 and 38 are phase locked by leaking waves through their top surfaces. Their output beams are coupled into a single-mode fiber 54 by lens system 48. Fiber 54 has an anti-reflection coating 52 on its angled end to reduce unwanted feedback, which can cause instability of output power and wavelength.

When light waves in diodes 37 and 38 are in phase, constructive interference occurs between their output beams and their output power is combined. The diodes can be of same or different types that have a thin-clad design and a thin metal contact layer, e.g., Fabry-Perot, DFB, DBR, or a semiconductor amplifier, which is sometimes called a gain chip, as along as their output spectra partially overlap. When a DBF diode having a narrow spectral width around 1550 nm and a broadband diode having a spectral range from 1535 to 1565 nm are coupled, the DFB diode dominates output wavelength of the broadband diode, and the diodes' power are combined at the DFB's wavelength. The stack-type device in FIG. 2-B is simple and compact and achieves larger single-mode output power than a single diode.

It is well known to those skilled in the art that phase locking between two diodes in such stack-type device is affected by diode characteristics and the spacing between the two top surfaces besides coupling efficiency. Therefore diode structure and dimensions and the spacing must be optimized. Moreover, drive current and temperature of the diodes can be used to fine tune phase relation between the diodes. In a passive phase locking mechanism, values of the drive current and temperature are chosen and fixed. In an active case, the values are adjusted in a feedback loop according to output power received by a power monitor.

The embodiment of FIG. 2-B can also be used to create schemes to tune the output wavelength. The tuning mechanism is quite similar to that of a SG-DBR or a SSG-DBR laser. SG-DBR and SSG-DBR lasers have a phase section, which fine tunes the phase, a gain section, which amplifies the light, and two Bragg reflector sections, which reflect light and feature a comb-like reflective spectrum. The output wavelength is selected by matching one peak of one comb to another peak of the other comb. To tune the wavelength, at least one spectrum is moved so that the two peaks coincide at another wavelength. Since a Bragg reflector causes considerable power loss and is difficult to fabricate, SG-DBR and SSG-DBR lasers, each having two of such reflector, suffer from low power and yield concerns.

To employ the embodiment of FIG. 2-B as a tunable laser similar to SG-DBR and SSG-DBR lasers, diodes 37 and 38 are designed to have a phase section, a gain section, and a Bragg reflector section which is located close to the diode's rear facet. The Bragg reflector gives the diodes a comb-like output spectrum. Since the diodes are coupled, their output wavelength can be generated by matching two peaks of the comb-like spectra. The resulting tunable laser has a similar fast tuning speed and a similar wide tuning range to SG-DBR and SSG-DBR lasers. But since each diode of the stack-type device has only one Bragg reflector, it has larger output power and a better yield. In addition, the total output power is further increased by constructive interference of the two diodes. Therefore the stack-type diode laser device produces high output power, fast tuning speed, and wide tuning range in a simple and compact structure.

FIGS. 3 and 4—Thin-Clad Diodes with Diffraction Gratings

Besides a thin metal contact layer, there are other ways for light waves to leak out through the top surface of a stack-type diode device. FIG. 3 shows schematically a cross-sectional view of a thin-clad diode having a diffraction grating on its top surface according to the invention. Like diode 38 in FIG. 2-A, the diode has region 28 containing cladding and contact layers, active region 25, and region 21 containing cladding and substrate layers. As in FIG. 3, an x-axis lies in the light propagation direction and a z-axis in a direction perpendicular to the top surface. A grating area usually consists of repetitive arrays of grating elements. In FIG. 3, grating elements 30 and 32 are arranged along x-axis. Grating element 30 represents a metal row, which is made by selectively etching or depositing metal contact layer. Element 32 represents a row where metal layer is etched. The rows are parallel to the y-axis (Not shown). A grating period L is the length addition of elements 30 and 32, as illustrated in FIG. 3. All the metal rows are connected electrically.

When interacting with an impinging light wave, a diffractive grating may generate waves in different directions. Each direction corresponds to a diffraction order which is represented by an integer, e.g. 0, 1, −1, 2, −2, etc. Elements 30 and 32 are constructed to generate a second-order diffraction. When the light waves propagate along the x-axis inside the diode, a second-order diffraction causes a portion of the light to radiate out through the top surface along the z-axis. Although the grating functions as a distributed Bragg reflector (DBR), it is often called grating coupler since the grating is frequently used to couple light waves traveling inside an edge-emitting laser diode into an optical fiber in a direction perpendicular to the diode's surface.

DFB or DBR diodes in a stack-type structure may employ a second-order grating and be coupled by second-order diffraction assuming the diffraction sections are aligned. When the diodes are the same, the spacing between their top surfaces must be optimized so that the light waves in the diodes are in phase. When different diodes are used, their structure and dimensions must be optimized, too.

FIG. 4 shows schematically a cross-sectional view of another thin-clad diode having a diffraction grating on its top surface according to the invention. The cross section is cut along a direction of light propagation in the diode. The diode of FIG. 4 is similar to the diode of FIG. 3 but has a different grating structure. In FIG. 4, a grating element 36 represents a row without a metal layer, and a grating element 34 a metal row; the latter is made by etching part of the contact layer, then depositing a metal contact layer in the etched place. As in FIG. 3, all the metal rows are connected electrically. Since element 34 is closer to the active region than element 32 in FIG. 3, it encounters stronger impinging light waves which propagate inside the diode. As a result, elements 34 and 36 generate stronger second-order diffraction and leaky waves.

CONCLUSION, RAMIFICATIONS, AND SCOPE

Accordingly, the reader will see that two thin-clad diodes of a stack-type device can be coupled by leaky waves through their top surfaces. The resulting stack-type diode laser device has a simple and compact structure. It produces a larger single-mode output than a single diode. In addition, it provides a tunable laser that has a wide tuning range, a fast tuning speed, and high output power.

Although the above description contains many specificities, these should not be construed as limiting the scope of the invention, but as merely providing illustrations of some of the presently preferred embodiments. Numerous modifications, alternations, and variations will be obvious to those skilled in the art.

For example, the diodes of a stack-type device can have different leaking structures, as long as adequate coupling efficiency is achieved.

Furthermore, other leaking structures besides a thin metal contact layer or a second-order grating which cause part of the light waves to radiate out through the top surface, can be used to couple stacked diodes.

Therefore the scope of the invention should be determined by the appended claims and their legal equivalents, rather than by the examples given.

The invention claimed is:

1. A semiconductor light source comprising:
   1) a first semiconductor laser diode arranged to emit a first output beam having a predetermined output spectrum for use at a predetermined wavelength in a first direction, said first laser diode including:
      a) a first top surface arranged facing a direction having a predetermined non-zero angle relative to said first direction;

b) a first light generating substructure disposed below said first top surface for generating a plurality of first light waves;

c) said first light generating substructure having a first active region substantially parallel to said first top surface;

d) a first coupling means for transmitting a predetermined portion of said first light waves through said first top surface;

2) a second semiconductor laser diode arranged to emit a second output beam having a predetermined output spectrum for use at a predetermined wavelength in a second direction, said second laser diode including:

a) a second top surface arranged facing a direction having a predetermined non-zero angle relative to said second direction;

b) a second light generating substructure disposed below said second top surface for generating a plurality of second light waves;

c) said second light generating substructure having a second active region substantially parallel to said second top surface;

d) a second coupling means for transmitting a predetermined portion of said second light waves through said second top surface; and 3) means for disposing said first and second laser diodes such that said first and second top surfaces are substantially parallel to each other and are held in proximity, and said first and second coupling means couple at least one of said pluralities of said first and second light waves to the other said plurality of said first or second light waves and lock said first and second light waves in a predetermined phase relation.

2. The light source according to claim 1 wherein said first and second laser diodes are disposed such that said first and second directions are substantially parallel.

3. The light source according to claim 1 wherein said first and second laser diodes are arranged such that a predetermined amount of said first light waves enters said second light generating substructure and a predetermined amount of said second light waves enters said first light generating substructure, respectively.

4. The light source according to claim 1 wherein said first and second laser diodes are constructed such that at least one of the laser diodes has its active region disposed substantially proximate to its top surface.

5. The light source according to claim 1 wherein said first and second laser diodes are disposed such that said first and second top surfaces are substantially proximate.

6. The light source according to claim 1 wherein at least one of said first and second coupling means comprises a diffractive grating.

7. The light source according to claim 1 wherein at least one of said first and second coupling means comprises a relatively thin metal contact layer.

8. The light source according to claim 1, further including tuning means for tuning the wavelength of at least one of said first and second output beams within a predetermined wavelength range.

9. The light source according to claim 1, further including lens means for coupling said first and second output beams into a single-mode waveguide.

10. A method for coupling a first and second semiconductor laser diodes, said method comprising:

1) providing said first semiconductor laser diode arranged to emit a first output beam having a predetermined output spectrum for use at a predetermined wavelength in a first direction, said first laser diode including:

a) a first top surface arranged facing a direction having a predetermined non-zero angle relative to said first direction;

b) a first light generating substructure disposed below said first top surface for generating a plurality of first light waves, said first light generating substructure having a first active region substantially parallel to said first top surface;

c) a first coupling means for transmitting a predetermined portion of said first light waves through said first top surface;

2) providing said second semiconductor laser diode arranged to emit a second output beam having a predetermined output spectrum for use at a predetermined wavelength in a second direction, said second laser diode including:

a) a second top surface arranged facing a direction having a predetermined non-zero angle relative to said second direction;

b) a second light generating substructure disposed below said second top surface for generating a plurality of second light waves, said second light generating substructure having a second active region substantially parallel to said second top surface;

c) a second coupling means for transmitting a predetermined portion of said second light waves through said second top surface;

3) disposing said first and second laser diodes such that said first and second top surfaces are substantially parallel to each other and are held in proximity; and 4) coupling at least one of said pluralities of said first and second light waves to the other said plurality of said first or second light waves and locking said first and second light waves in a predetermined phase relation.

11. The method according to claim 10 wherein said first and second laser diodes are constructed such that said first and second active regions are proximate to said first and second top surfaces, respectively.

12. The method according to claim 10 wherein said first and second laser diodes are disposed such that said first and second top surfaces are in substantial proximity.

13. The method according to claim 10 wherein at least one of said first and second coupling means comprises a relatively thin metal contact layer.

14. The method according to claim 10 wherein at least one of said first and second coupling means comprises a diffractive grating.

15. The method according to claim 10, further including tuning the wavelength of at least one of said first and second output beams within a predetermined wavelength range.

16. The method according to claim 10, further including coupling said first and second output beams into a single-mode waveguide.

* * * * *